US009148981B2

(12) United States Patent
Beck et al.

(10) Patent No.: US 9,148,981 B2
(45) Date of Patent: Sep. 29, 2015

(54) APPARATUS AND METHOD FOR FACILITATING COOLING OF AN ELECTRONICS RACK

(76) Inventors: Kevin Brandon Beck, Atlanta, GA (US); Ross Eugene Goodwin, Buford, GA (US)

(*) Notice: Subject to any disclaimer, the term of this patent is extended or adjusted under 35 U.S.C. 154(b) by 0 days.

(21) Appl. No.: 12/905,828

(22) Filed: Oct. 15, 2010

(65) Prior Publication Data

US 2011/0122570 A1 May 26, 2011

(51) Int. Cl.
H05K 7/20 (2006.01)
F24F 13/00 (2006.01)
E04F 15/00 (2006.01)
F24F 13/068 (2006.01)
E04F 15/024 (2006.01)

(52) U.S. Cl.
CPC ....... H05K 7/20745 (2013.01); *E04F 15/02405* (2013.01); *F24F 13/068* (2013.01)

(58) Field of Classification Search
CPC ............ H05K 7/20554; H05K 7/2059; H05K 7/20718; H05K 7/20745; E04B 9/122; E04B 9/127; E04C 2/423; E04C 2/425; E04C 5/04; E04F 15/02405; F24F 13/068
USPC .................. 361/691, 692, 694–695, 724–727, 361/679.46, 679.48–679.51; 454/184, 247, 454/270–273, 277–283, 292, 330; 165/80.2; 257/712, 721; 174/15.1, 174/16.1; 62/186
See application file for complete search history.

(56) References Cited

U.S. PATENT DOCUMENTS

| | | | | | |
|---|---|---|---|---|---|
| 3,065,685 | A * | 11/1962 | Sylvester et al. | ............. | 454/316 |
| 6,019,677 | A * | 2/2000 | Demster | ....................... | 454/290 |
| 6,256,952 | B1 * | 7/2001 | Fahy et al. | ..................... | 52/263 |
| 6,747,872 | B1 * | 6/2004 | Patel et al. | .................... | 361/695 |
| 6,862,179 | B2 * | 3/2005 | Beitelmal et al. | ........ | 361/679.53 |
| 7,057,506 | B2 * | 6/2006 | Bash et al. | .................... | 340/524 |
| 7,347,058 | B2 * | 3/2008 | Malone et al. | ............... | 62/259.2 |
| 7,716,939 | B1 * | 5/2010 | Morales | ....................... | 62/259.2 |
| 7,907,402 | B2 * | 3/2011 | Caveney | ....................... | 361/694 |
| 8,511,022 | B2 * | 8/2013 | Curtin et al. | .................. | 52/302.1 |
| 8,733,060 | B2 * | 5/2014 | Curtin et al. | .................... | 52/664 |
| 2007/0125107 | A1 * | 6/2007 | Beam | ............................. | 62/186 |
| 2009/0129015 | A1 * | 5/2009 | Nobile | ......................... | 361/692 |
| 2009/0156114 | A1 * | 6/2009 | Ahladas et al. | ............... | 454/184 |
| 2009/0293518 | A1 * | 12/2009 | Bettella | .......................... | 62/186 |
| 2012/0009862 | A1 * | 1/2012 | Meyer | .......................... | 454/184 |

FOREIGN PATENT DOCUMENTS

DE  202009007257   * 11/2009 ............... F24F 7/00
JP       06174260   *  6/1994 ............... F24F 3/00

* cited by examiner

Primary Examiner — Zachary M Pape
(74) Attorney, Agent, or Firm — Robert J. Veal

(57) ABSTRACT

Disclosed is both a method and apparatus for delivering cooling air to an electronics rack in a data room in an energy efficient manner. The present apparatus provides directionally delivered cooling air to an electronics rack with usage rates up to 90%. The tiles utilize angled directional vanes for delivering the cooling air. The tiles both conserve energy and increase the overall possible power usage for each cabinet. The tiles greatly increase the cooling efficiencies in the data room and conserve energy.

18 Claims, 3 Drawing Sheets

APPARATUS AND METHOD FOR FACILITATING COOLING OF AN ELECTRONICS RACK

TECHNICAL FIELD

The present invention generally relates to both an apparatus and method for cooling an electronics rack of a data room while conserving energy. In greater detail, the invention facilitates the air cooling of rack-mounted assemblages such as computer server units by directing a cool air flow to the front of the rack whereby up to 90% of the directed air is used to cool the rack.

BACKGROUND

Electronic equipment racks are generally designed to receive a number of electronic components arranged vertically in the rack, mounted on shelves, and/or to front and rear mounting rails. The electronic equipment may include, for example, printed circuit boards, communications equipment, computers, including computer servers, or other electronic components.

Electronic equipment housed in racks produces a considerable amount of heat, which undesirably affects performance and reliability of the electronic equipment. Often the heat produced by the rack-mounted components is not evenly distributed in the racks. Inadequate supply of cool air and hot air recirculation can reduce equipment reliability substantially and can cause other performance problems. Accordingly, rack-mounted computer systems typically require effective cooling systems to maintain operational efficiency. Cooling can be accomplished by introducing cooled air into an equipment rack and causing the air to flow through equipment in the rack to remove some or all of the heat. The air exits the rack at an increased temperature.

A conventional solution for cooling racks of electronic equipment is to position the equipment racks in rows on a raised floor in a hot aisle and cold aisle configuration, with the fronts of the equipment racks in one row facing the fronts of the equipment racks in an adjacent row. Air cooled by a central air conditioning system is ducted under the raised floor, and perforated or vented floor tiles are provided in the cold aisles to release chilled air towards the fronts of the equipment racks. Chilled air is then drawn into the equipment mounted in the rack and heated air is exhausted out the back of each rack into the hot aisle.

Unfortunately, as technology has rapidly progressed to ever smaller computer chips used to perform more tasks at faster rates the heat produced by such has increased exponentially. The perforated tiles used to deliver air from the subfloor into the room's ambient air can only direct it straight up causing the need for the servers in the cabinets to pull air in a horizontal direction while the natural air flow is in a vertical motion sometimes flowing at a rate of 1000 CFM. However, this process does not work in an efficient manner given the new heat loads encountered in modern data centers.

The rate of actual usage of airflow into the server cabinets as evaluated by floor manufacturing companies ranges from as low as 30% of all air produced in the data centers. This is not to mention that the servers exhaust fans have heat sync's that cause them to ramp up in speed thus using more energy because of the lack of cooling they are receiving from the supply. Studies have been performed to show how even turning up the set point on the air handlers to try to save energy has caused these server fans to use as much energy as the owner thought they were saving by making these changes.

Thus, what is needed is an apparatus and method for delivering a cooling air to the data center racks in an energy efficient manner to meet the needs of ever increasing heat loads.

SUMMARY

The present apparatus and method provides a means for cooling electronics racks found in a data room. The invention includes a tile for a raised access floor system capable of delivering up to a 90% usage rate of cool air to the server cabinet or electronics rack. A single tile can deliver cool air for up to three electronics racks as opposed to the normal single tile for each rack. The tiles both conserve energy and increase the overall possible power usage for each cabinet. The directional cooling of the tile greatly increases the cooling efficiencies in the data room.

In greater detail, the invention includes an apparatus for facilitating air cooling of a data center's electronics rack having a tile residing within a raised floor of the data center. Cooling air is conveyed from an under-floor cold air plenum through the tiles. The apparatus includes at least one tile assembly for disposition external to the electronics rack. The assembly includes a frame supporting a plurality of spaced apart vanes for directing an air flow towards the electronics rack. The vanes are positioned at an angle between about 25 to 45 degrees from a plane which is perpendicular to the raised floor of the data center.

Additionally, the vanes may be positioned at an angle which is between about 30 to 40 degrees from the plane perpendicular to the raised floor of the data center. Furthermore, the angle may be set at about 35 degrees from the plane perpendicular to the raised floor of the data center. In a further embodiment, the vanes may be pivotly connected to the frame and the vanes may be restricted in movement to 25 to 45 degrees from the plane perpendicular to the raised floor of the data center.

In various embodiments, the tile can deliver between about 50 percent to about 90 percent of the cool air flowing from the tile to the electronics rack. The tile assembly may be disposed external to at least three electronics racks and providing cooling to the three racks to which the tile is disposed. In such a configuration, the tile is typically positioned adjacent to the middle rack.

A further embodiment includes a data center. The data center includes a sub-floor and a raised floor constructed above the sub-floor defining a plenum between the sub-floor and the raised floor. The raised floor includes a plurality of floor tiles, with at least one floor tile comprising a tile assembly for disposition external to the electronics rack for delivering cool air to the rack.

An additional embodiment further includes a method for facilitating air cooling of an electronics rack of a data center. The method includes the step of supplying a cooling air to the electronic rack, wherein the supplied air flows from an under-floor cold air plenum formed between a sub-floor and a raised floor. The method also includes the step of directing the supplied cool air to the electronics rack at an angle which is between about 25 to 45 degrees from a plane perpendicular to the raised floor of the data center.

DRAWING

DETAILED DESCRIPTION

Disclosed is both a method and apparatus for delivering cooling air to an electronics rack in a data room in an energy efficient manner. The present apparatus provides directionally delivered cooling air to an electronics rack. The tiles can deliver the cool air in an efficiency rate of up to 90% verses the 30% currently delivered by conventional air tiles. The tiles utilize directional vanes set to a desired angle for delivering the cooling air. The tiles both conserve energy and increase the overall possible power usage for each cabinet. The tile's directional cooling greatly increases the cooling efficiencies in the data room.

As used herein, the terms "electronics rack", "rack-mounted electronic equipment", "server cabinet" and "rack unit" are used interchangeably, and include any housing, frame, rack, compartment, blade server system, having one or more heat generating components of a computer system or electronics system, and may be, for example, a stand alone computer processor having high, mid or low end processing capability.

In one embodiment, an electronics rack may comprise multiple electronics subsystems or drawers each having one or more heat generating components disposed therein requiring cooling. "Electronics subsystem" refers to any sub-housing, blade, book, drawer, node, compartment having one or more heat generating electronics components disposed therein. Electronics subsystems of an electronics rack may be movable or fixed relative to the electronics rack, with the rack-mounted electronics drawers of a multi-drawer rack unit and blades of a blade center system being two examples of subsystems of an electronics rack to be cooled.

Figure 1:
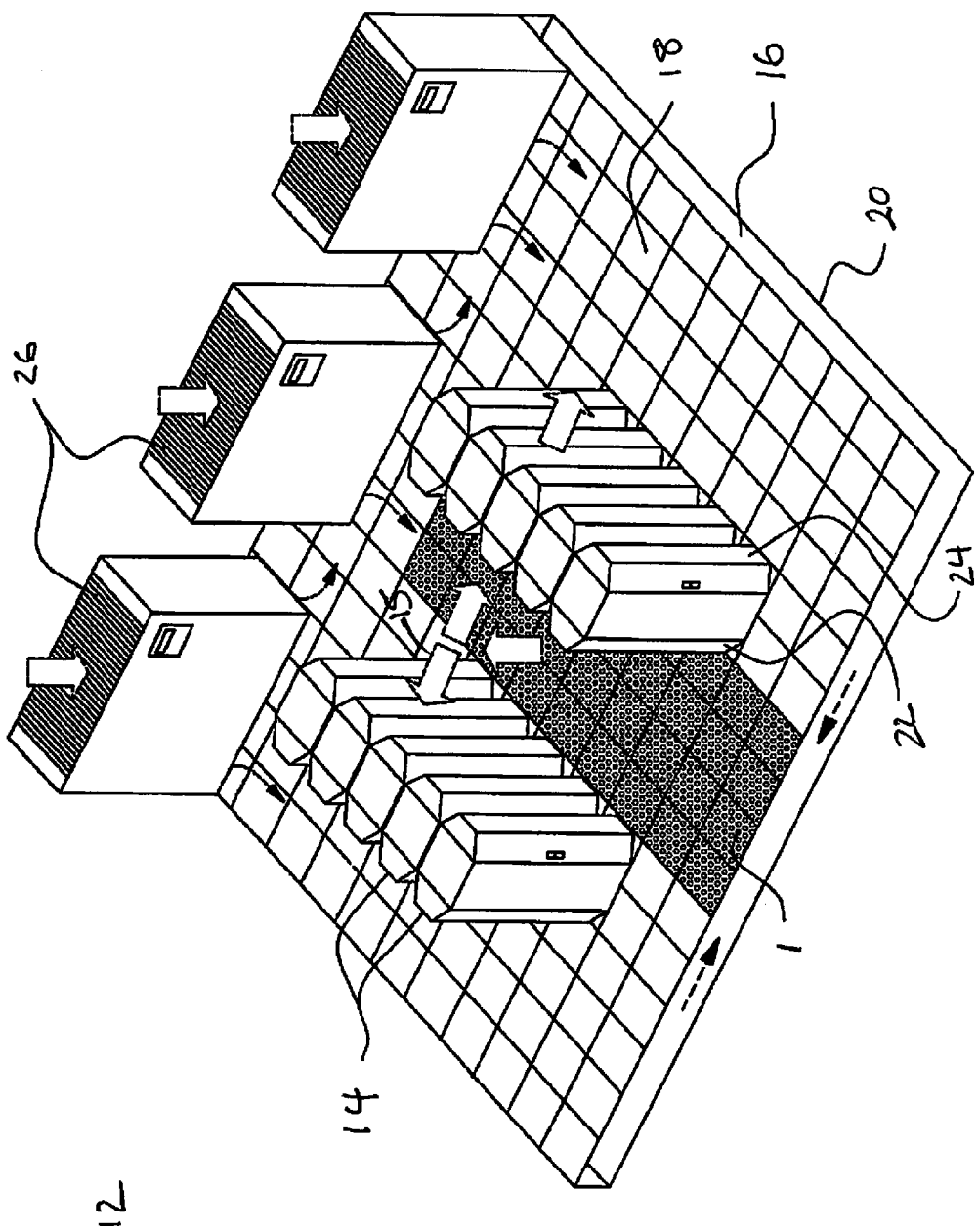
FIG. 1 depicts one embodiment of the raised floor layout of an air-cooled data center.

As shown in FIG. 1, in a raised floor layout of an air cooled computer installation or data center 12 with multiple electronics racks 14 disposed in one or more rows. A computer installation such as depicted in FIG. 1 may house several hundred, or even several thousand microprocessors.

In the arrangement of FIG. 1, chilled air enters the computer room via floor vents from a supply air plenum 16 defined between the raised floor 18 and a base or sub-floor 20 of the room. Cool air is taken in through louvered air inlet covers or doors 22 of the electronics racks and expelled through louvered air outlet covers or doors 24 of the electronics racks. Each electronics rack 14 may have an air-moving device (e.g., fan or blower) to provide forced inlet-to-outlet airflow to cool the electronic components within the drawer(s) of the rack. The supply air plenum 16 provides conditioned and cooled air 15 to the air-inlet sides of the electronics racks 14 via perforated floor tiles 1 disposed in a "cold" air aisle of the data center.

The conditioned and cooled air is supplied to plenum 16 by one or more air-conditioning units 26, also disposed within the computer installation 12. Room air is taken into each air-conditioning unit 26 near an upper portion thereof. This room air comprises in part exhausted air from the "hot" air aisles of the data center defined by opposing air outlet sides of the electronics racks 14.

Figure 2:
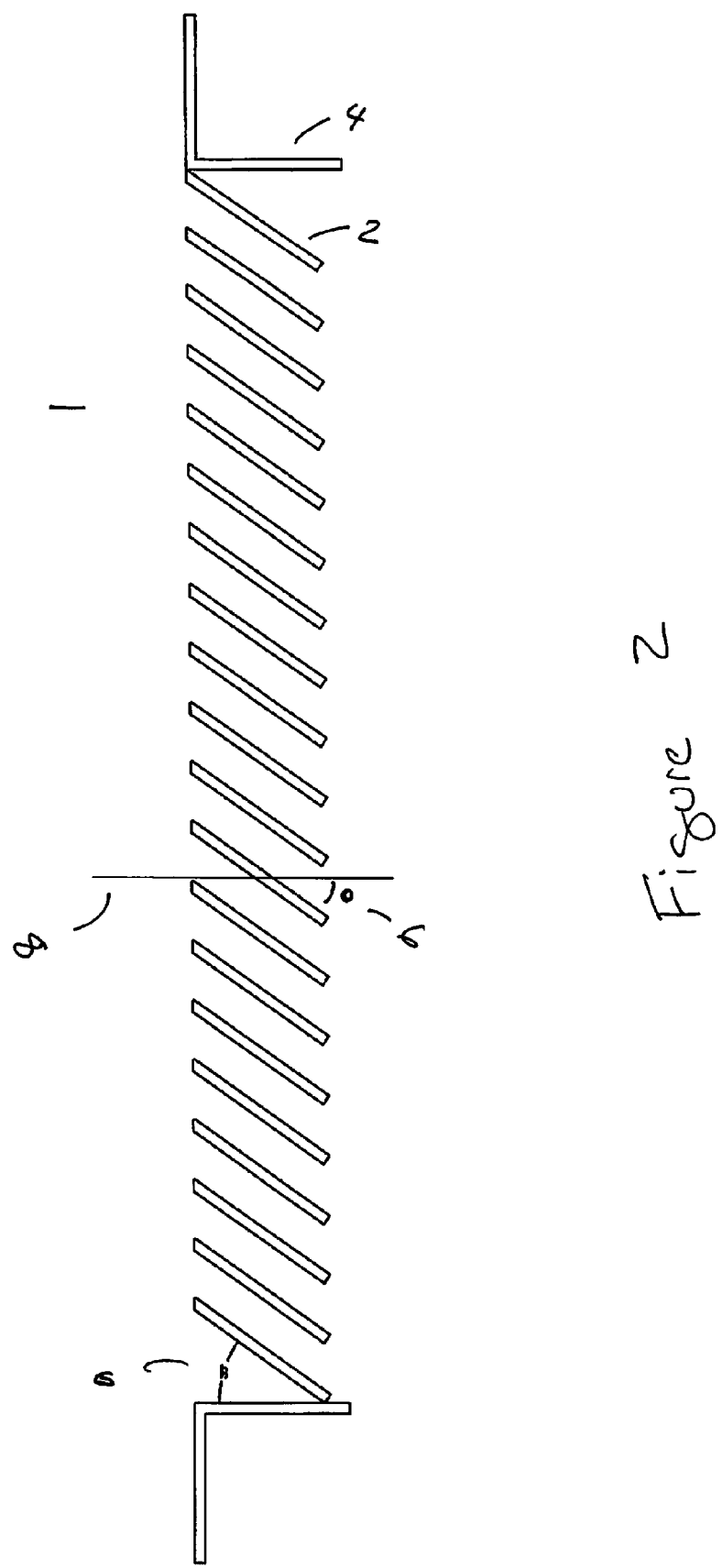
FIG. 2 is a cutaway view of the tile showing the vanes and the frame and the angle formed between the vanes and the perpendicular plane of the floor.

FIG. 2 illustrates the tile 1 in an embodiment in the present apparatus for facilitating air cooling of an electronics rack 14 of a data center. The tile resides within a raised floor 18 of the data center. Cooling air is conveyed from an under-floor cold air plenum 18 though the tiles 1. The apparatus includes at least one tile assembly 1 located external to the electronics rack 14. The assembly 1 includes a frame 4 supporting a plurality of spaced apart vanes 2 for directing an air flow towards the electronics rack 14. The vanes 2 are positioned at an angle 6 which is between about 25 to 45 degrees from a plane 8 which is perpendicular to the raised floor 18 of the data center. The tile assembly 1 may be formed from most any material such as a metal including aluminum.

Additionally, the vanes 2 may be positioned at an angle 6 which is between about 30 to 40 degrees from the plane perpendicular to the raised floor 18 of the data center. Furthermore, the angle may be set at about 35 degrees from the plane perpendicular to the raised floor 18 of the data center. In a further embodiment, the vanes 2 may be pivotly connected to the frame 4 and the vanes 2 may be restricted in movement to about 25 to 45 degrees from the plane 8 which is perpendicular to the raised floor of the data center.

In various embodiments, the tile 1 can deliver between about 50 percent to about 90 percent of the cool air flowing from the tile 1 to the electronics rack 14. The tile assembly 1 may be disposed external to at least three electronics racks 14 and providing cooling to the three racks to which the tile 1 is disposed. In such a configuration the tile 1 is typically positioned adjacent to the middle rack.

Figure 3:
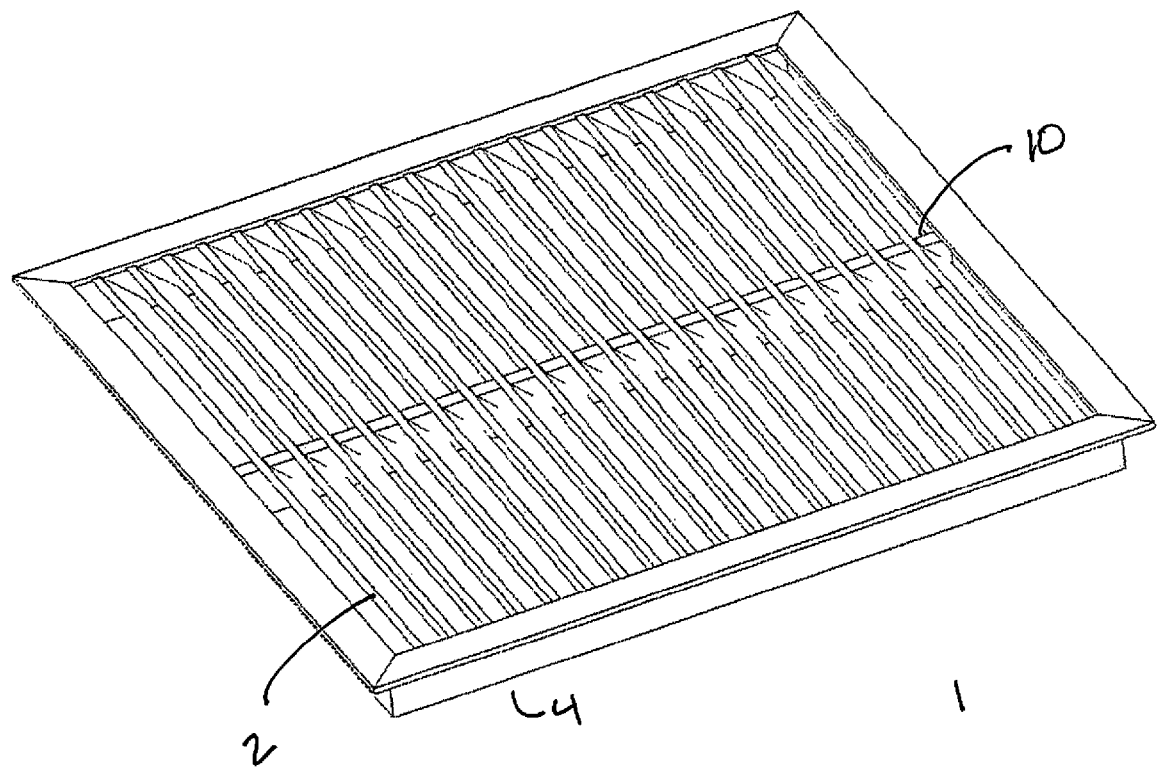
FIG. 3 is a view of the tile and angled vanes with a cross brace for added support.

FIG. 3 is a further view of the tile 1. In this view the tile 1 has vanes 2 angled to direct an airflow to the electronics rack 14. The tile 1 includes a frame 4 and a support 10 in an embodiment. The frame 4, vanes 2 and support 10 may be formed from the same materials or different materials depending upon the chosen materials. The dimensions of the tile 1 can be configured to fit within the raised floor 18. By way of example and not limitation the tile 1 may be about 24 inches square.

Further embodiments include both embodiments with a method and data center. The data center embodiment includes a sub-floor 20 and a raised floor 18 constructed above the sub-floor 20 defining a plenum 16 between the sub-floor 20 and the raised floor 16. The raised floor 16 includes a plurality of floor tiles, with at least one floor tile comprising a tile assembly 1 for disposition external to the electronics rack 14 for delivering cool air 15 to the rack 14.

The method embodiment includes a method for facilitating air cooling of an electronics rack 14 of a data center. The method includes the step of supplying a cooling air 15 to the electronics rack 14, wherein the supplied air flows from an under-floor cold air plenum 16 formed between a sub-floor 20 and a raised floor 18. The method also includes the step of directing the supplied cool air 15 to the electronics rack 14 at an angle 6 which is between about 25 to 45 degrees from a plane 8 perpendicular to the raised floor 18 of the data center.

While Applicant has set forth embodiments as illustrated and described above, it is recognized that variations may be made with respect to disclosed embodiments. Therefore, while the invention has been disclosed in various forms only, it will be obvious to those skilled in the art that many additions, deletions and modifications can be made without departing from the spirit and scope of this invention, and no undue limits should be imposed except as set forth in the following claims.

What is claimed is:

1. An apparatus for facilitating air cooling of an electronics rack of a data center, the apparatus residing within a raised floor of the data center wherein cooling air is conveyed from an under-floor cold air plenum, the apparatus comprising:

at least one tile assembly for disposition external to the electronics rack, the assembly includes a frame supporting a plurality of spaced apart vanes for directing an air flow towards the electronics rack, and the vanes positioned and set at a fixed angle which is between about 25 to 45 degrees from a plane which is perpendicular to the raised floor of the data center and a support housed within the frame and connected to the frame and the support further supporting the plurality of spaced apart fixed vanes.

2. The apparatus of claim 1, further including the vanes positioned at an angle which is between about 30 to 40 degrees from the plane which is perpendicular to the raised floor of the data center.

3. The apparatus of claim 1, further including the vanes positioned at an angle which is about 35 degrees from the plane which is perpendicular to the raised floor of the data center.

4. The apparatus of claim 1, wherein the tile assembly is disposed external to at least three electronics racks and providing cooling to the three racks to which the tile is disposed.

5. The apparatus of claim 1, wherein the tile delivers between about 50 percent to about 90 percent of the cool air flowing from the tile from the under-floor cold air plenum to the electronics rack.

6. The apparatus of claim 1, wherein the vanes have a first end and a second end, and the first end having a plane parallel to the raised floor of the data center whereby rolling loads may pass over the tile assembly.

7. A datacenter comprising:
 a sub-floor;
 a raised floor constructed above the sub-floor so as to define a plenum between the sub-floor and the raised floor, the raised floor comprising a plurality of floor tiles, at least one floor tile comprising a tile assembly for disposition external to an electronics rack;
 the tile assembly including a frame supporting a plurality of spaced apart vanes for directing an air flow towards the electronic rack and the vanes positioned at a set angle which is fixed between about 25 to 45 degrees from a plane which is perpendicular to the raised floor of the data center and a support housed within the frame and connected to the frame and the support further supporting the plurality of spaced apart fixed vanes.

8. The data center of claim 7, further including the vanes positioned at an angle which is between about 30 to 40 degrees from the plane which is perpendicular to the raised floor of the data center.

9. The data center of claim 7, further including the vanes positioned at an angle which is about 35 degrees from the plane which is perpendicular to the raised floor of the data center.

10. The data center of claim 7 wherein the tile assembly is disposed external to at least three electronics racks and providing cooling to the three racks to which the tile is disposed.

11. The data center of claim 7, wherein the vanes have a first end and a second end, and the first end having a plane parallel to the raised floor of the data center whereby rolling loads may pass over the tile assembly.

12. A method of facilitating air cooling of an electronics rack of a data center, the method comprising the steps of:
 supplying a cooling air to the electronics rack, wherein the supplied air flows from an under-floor cold air plenum forced between a sub-floor and a raised floor; and
 directing the supplied cool air to the electronics rack at a set angle which is fixed between about 25 to 45 degrees from a plane which is perpendicular to the raised floor of the data center.

13. The method of claim 12, wherein between about 50 percent to about 90 percent of the directed cool air is utilize by the electronics rack.

14. The method of claim 13, wherein between about 70 percent to about 90 percent of the directed cool air is utilize by the electronics rack.

15. The method of claim 12, further including directing the supplied cool air to the electronics rack at an angle which is between about 30 to 40 degrees from the plane which is perpendicular to the raised floor of the data center.

16. The method of claim 12, further including directing the supplied cool air to the electronics rack at a 35 degree angle from a plane which is perpendicular to the raised floor of the data center.

17. The method of claim 12, wherein the supplied air is directed to a plurality of electronics rack via a single tile.

18. The method of claim 12 wherein three racks are cooled via a single tile.

* * * * *